(12) United States Patent
Tikovsky et al.

(10) Patent No.: US 8,883,618 B2
(45) Date of Patent: Nov. 11, 2014

(54) METHOD AND DEVICE FOR THE TREATMENT OF A SEMICONDUCTOR SUBSTRATE

(75) Inventors: Andreas Tikovsky, Markt Schwaben (DE); Matthias Laumbacher, Regensburg (DE); Gerhard Reichl, Regensburg (DE)

(73) Assignees: L'Air Liquide, Societe Anonyme pour l'Etude et l'Exploitation des Procedes Georges Claude, Paris (FR); Infineon Technologies AG, Neubiberg (DE)

( * ) Notice: Subject to any disclaimer, the term of this patent is extended or adjusted under 35 U.S.C. 154(b) by 1353 days.

(21) Appl. No.: 12/666,878

(22) PCT Filed: Jun. 27, 2008

(86) PCT No.: PCT/EP2008/058343
§ 371 (c)(1),
(2), (4) Date: Jul. 1, 2011

(87) PCT Pub. No.: WO2009/000933
PCT Pub. Date: Dec. 31, 2008

(65) Prior Publication Data
US 2011/0250740 A1    Oct. 13, 2011

(30) Foreign Application Priority Data
Jun. 28, 2007   (DE) .................. 10 2007 030 106

(51) Int. Cl.
*H01L 21/265* (2006.01)
*G21K 5/10* (2006.01)
*H01J 37/317* (2006.01)
*H01J 37/08* (2006.01)

(52) U.S. Cl.
CPC ..... *H01J 37/3171* (2013.01); *H01J 2237/0206* (2013.01); *H01J 37/08* (2013.01); *H01J 2237/006* (2013.01)

USPC ............... 438/514; 250/492.21; 257/E21.334

(58) Field of Classification Search
None
See application file for complete search history.

(56) References Cited

U.S. PATENT DOCUMENTS

| 4,644,780 | A | 2/1987 | Jeter |
| 4,779,652 | A | 10/1988 | Sweeney |

(Continued)

FOREIGN PATENT DOCUMENTS

| CH | 664 204 A5 | 2/1988 |
| DE | 41 35 200 A1 | 4/1993 |

OTHER PUBLICATIONS

Wolf S et al: "Ion Impantation for VLSI" 1-15 Silicon Processing for the VLSI ERA, Lattice Press, Sunset Beach, California, Bd. 1, Jan. 1, 1986, Seiten 280-330.

(Continued)

*Primary Examiner* — Seahvosh Nikmanesh
(74) *Attorney, Agent, or Firm* — Young & Thompson

(57) ABSTRACT

Method for the treatment of a semiconductor substrate (2), in which an ion beam (4) is produced from a doping gas and is directed onto the semiconductor substrate (2), characterized in that the doping gas is fed through a plastic hose (6) to a unit (3) for producing an ion beam (4), and is then ionized. The method and the device advantageously permit the supply of the unit 3 for producing an ion beam 4 with a doping gas from customary gas reservoirs 14 such as customary compressed gas cylinders, for example. Voltage flashovers from the deflection elements 5 are effectively prevented by the use of a plastic hose 6. The method and the device thus permit the simple construction of a corresponding ion implantation apparatus in conjunction with possible inexpensive supply thereof with doping gas.

19 Claims, 2 Drawing Sheets

(56) References Cited

U.S. PATENT DOCUMENTS

Figure 1:
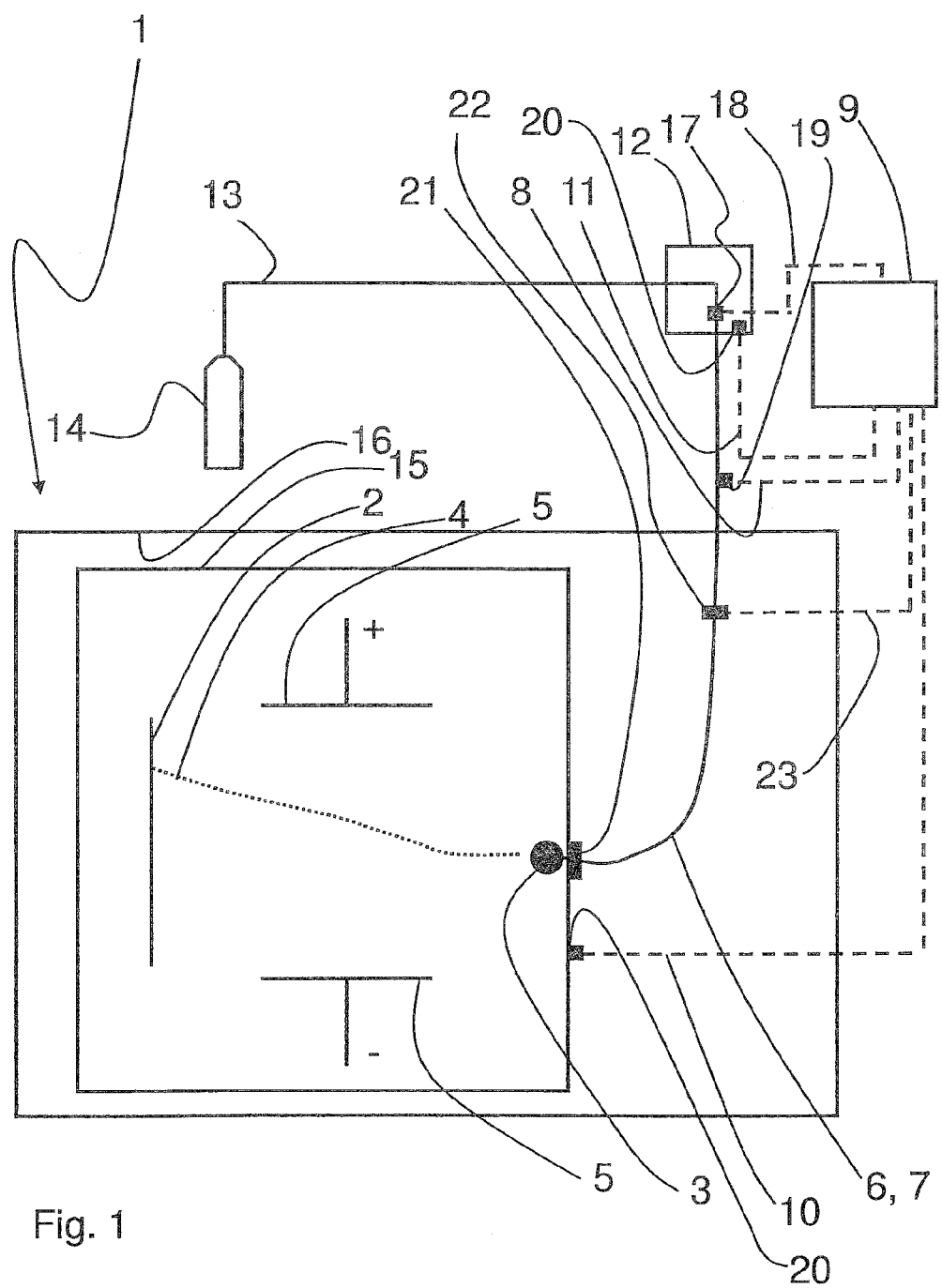

| | | |
|---|---|---|
| 5,307,568 A | 5/1994 | Matsuo et al. |
| 5,715,587 A | 2/1998 | Ziu |
| 5,971,029 A | 10/1999 | Smith et al. |
| 6,020,033 A | 2/2000 | Kern |
| 2007/0074759 A1 | 4/2007 | McClung |

OTHER PUBLICATIONS

International Search Report in Corresponding Application PCT/EP2008/058343 dated Sep. 9, 2009.

METHOD AND DEVICE FOR THE TREATMENT OF A SEMICONDUCTOR SUBSTRATE

The subject of this invention is a method and a device for the treatment of a semiconductor substrate, a so-called wafer, in particular for doping by means of ion implantation.

The doping of wafers by means of the ion implantation method is known. In this case, an ion beam, which is directed onto the corresponding semiconductor substrate, is generated from a doping gas stream. The penetrating doping ions form contaminants in the grid, which change the corresponding properties of the semiconductor. By specific directing of the ion beam to certain areas of the semiconductor substrate, semiconductors of certain functions can thus be produced.

As doping gases, for example, highly toxic gases such as phosphine ($PH_3$), arsine ($AsH_3$), boron trifluoride ($BF_3$) or silicon tetrafluoride ($SiF_4$), which are toxic and/or inflammatory, are used in this case. To prevent others from being endangered by these gases in the implantation process, to date the latter have been supplied in cylinders, as they are described in, for example, U.S. Pat. No. 6,743,278. These cylinders have a small gas capacity, the effect of which is, on the one hand, that these gas cylinders often have to be changed, and, on the other hand, that in this case semiconductor substrates are produced that cannot be completely closed off, since the filling level of the corresponding cylinders cannot be monitored. This produces a high scrapping of semiconductor substrate, which results in high costs for the corresponding manufacturer.

Based on this, the object of this invention is to provide a method and a device with which the drawbacks of the prior art can at least be alleviated, and in particular a supply of ion implantation processes can be carried out with doping gas, in which electrical flashovers do not occur in feeds, and at the same time the risk created by possible leaks in the line is limited.

This object is achieved by a method and a device with the features of the respective independent claims. The respective dependent claims are directed toward advantageous further developments.

In the method according to the invention for the treatment of a semiconductor substrate, an ion beam is generated from a doping gas and directed onto the semiconductor substrate. According to the invention, the doping gas is fed through a plastic hose to a means for generating an ion beam and is then ionized.

According to an especially preferred configuration of the method, in which all further developments proposed in this document can be applied and transferred, a method for the treatment of a semiconductor substrate is proposed, in which an ion beam is generated from a doping gas and is directed onto the semiconductor substrate, whereby the doping gas is fed through a plastic hose to a means for generating an ion beam and then is ionized, whereby the plastic hose is enclosed by a buffer hose, which is filled with a buffer gas.

Doping gas is defined in particular here as arsine, phosphine, boron trifluoride and/or silicon tetrafluoride. In particular, the connection with the plastic hose to a conventional gas cylinder, which is positioned outside of the housing of the device for the treatment of the semiconductor substrates, is carried out. This allows the use of conventional compressed cylinders as reservoirs for one or more doping gases. By using the plastic hose for feeding the doping gas or gases, effective voltage flashovers are prevented. In addition, commercially available gas cylinders with clearly higher capacity than that of the cylinders known from the prior art can be used. Since these cylinders also, for example, via the monitoring of the applied pressure, make it possible to estimate the amount left in the gas cylinder, it is possible to time the cylinder change precisely, so that the scrapping of semiconductor substrates is reduced to the absolute minimum. The amount of scrapping of semiconductor substrates that is produced can be further reduced if each gas reservoir is designed redundantly, for example in the form of several interchangeable gas cylinders.

In this case, a semiconductor substrate is defined in particular as a preferably monocrystalline substrate, in particular one that consists of silicon. In addition, within the scope of this invention, a semiconductor substrate is defined in particular as a so-called wafer. In particular in this case, if an ion implantation method is applied, a possible later thermal recovery of the doped substrate is possible. The electric voltages, which are achieved with the ion implantation method, are often in the range of 90 to 250 kV.

According to an advantageous configuration of the method, a deflection of the ion beam is generated by applying at least one electrical field.

In particular here, an electrical field is produced by applying a high voltage, for example as a d.c. voltage or else a.c. voltage of 90 kV and more. Because of the electrical charge of the ions in the ion beam, the ion beam can advantageously be directed onto specific areas of the semiconductor substrate. The electrical field is preferably oriented essentially perpendicular to the primary direction of movement of the ion beam.

According to another advantageous configuration of the method according to the invention, the plastic hose is enclosed by a buffer hose, which is filled with a buffer gas.

The buffer hose is also advantageously designed as a plastic hose with a larger diameter. Plastic hoses and buffer hoses are preferably designed concentrically and/or coaxially. The buffer gas serves the purpose, on the one hand, of protecting the environment from the doping gas and, on the other hand, of detecting leaks. As buffer gas, preferably an inert gas is used, in particular an inert gas whose atomic weight differs significantly from that of the doping elements in the doping gas. In particular, nitrogen, argon and/or sulfur hexafluoride are used.

Plastic hoses and/or buffer hoses are preferably made of tetrafluoroethylene/perfluoroalkoxy/vinyl ether-copolymerizate (PFA). As an alternative or in addition, plastic hoses and/or buffer hoses can be made of polyvinylidene fluoride (PVDF).

According to another advantageous configuration of the method according to the invention, the pressure of the buffer gas is monitored.

This can be carried out by, for example, designing a manometer, which is connected—or can be connected—to the buffer hose. The monitoring of the pressure can be carried out continuously and/or intermittently. When the pressure of the buffer gas drops, a leak in the plastic hose can be sealed off. In particular, here, an analysis can be carried out over time, in which an especially strong drop in pressure of the buffer gas is evaluated as a reference for a leak in the plastic hose and/or buffer hose, and a corresponding reaction takes place. If, in addition, the pressure of the doping gas is also monitored, it can be determined whether plastic hoses and/or buffer hoses have a leak.

According to another advantageous configuration of the method according to the invention, the buffer gas has a filling pressure of 1.4 to 2.0 bar.

In particular, a pressure of 1.4 to 1.8 bar, preferably about 1.5 bar, has proven advantageous, in particular when the pressure of the doping gas is lower, for example at about 0.8 to 1.0 bar, in particular at about 0.9 bar. Within the scope of this invention, the indicated pressure is defined in each case as the absolute pressure. The pressure difference between the pressure of the buffer gas, the ambient pressure, and the pressure of the doping gas is selected so that a clearly measurable drop in pressure occurs when a leak is present.

According to another advantageous configuration of the method according to the invention, at least one of the following actions is performed when the pressure of the buffer gas falls below a boundary pressure:

I) Emitting a warning, and
II) Interrupting the supply of doping gas.

A drop in pressure indicates a leak of the plastic hose and/or of the buffer hose. Depending upon the size of the leak, in this case an alert is also sent to an operator and/or the supply of doping gases is interrupted.

The boundary pressure is preferably 70 to 90% of the filling pressure of the buffer gas.

A drop in the filling pressure to the boundary pressure indicates with high probability a corresponding leak, since a drop in pressure of the buffer gas takes place clearly more slowly because of, for example, diffusion, than a pressure drop because of a leak. The speed of the drop in pressure is therefore also monitored advantageously and taken into consideration in the selection of corresponding actions. A boundary pressure of about 80% of the filling pressure of the buffer gas is preferred.

According to another advantageous configuration of the method according to the invention, the doping gas comprises compounds of at least one of the following elements:

A) Phosphorus (P);
B) Arsenic (As);
C) Antimony (Sb);
D) Boron (B);
E) Aluminum (Al);
F) Indium (In);
G) Gallium (Ga);
H) Germanium (Ge);
I) Carbon (C);
J) Hydrogen (H);
K) Chlorine (Cl);
L) Oxygen (O);
M) Bromine (Br);
N) Nitrogen (N);
j) Silicon (Si), and
P) Fluorine.

Especially preferred is an approach in which the doping gas comprises at least one of the following gases:

i) Arsine ($AsH_3$);
ii) Phosphine ($PH_3$);
iii) Boron trifluoride ($BF_3$), and
iv) Silicon tetrafluoride ($SiF_4$).

These gases have proven especially advantageous in the generation of the ion beam. The corresponding doping elements arsenic (As), phosphorus (P), boron (B), and silicon (Si) have proven especially advantageous.

According to another advantageous configuration of the method according to the invention, the doping gas is fed at a pressure of 0.8 to 1.0 bar.

In particular, a preferred pressure is approximately 0.9 bar. In this case, after generation, the ion beam crosses through an evacuated area before it strikes the corresponding semiconductor substrate.

According to another advantageous configuration of the method according to the invention, the doping gas is supplied so that the volume flow of the doping gas is in the range of 1 to 10 ml/s (milliliters per second).

These volume flows have proven especially advantageous, since as complete a supply of the means as possible to generate an ion beam thus can be ensured.

According to another aspect of this invention, a device for the treatment of a semiconductor substrate is proposed, in which a means to generate an ion beam and deflection means for deflecting the ion beam are designed, with which an ion beam can be directed onto the semiconductor substrate at least in predetermined areas. The device according to the invention is distinguished in that the means for generating an ion beam is connected to a plastic hose, via which the means can be supplied with a doping gas.

According to an especially preferred configuration of the device, to which all further developments proposed in this document can be applied and transferred, a device for the treatment of a semiconductor substrate is proposed, in which a means for generating an ion beam and deflection means for deflecting the ion beam are designed, with which an ion beam can be directed onto the semiconductor substrate at least in predetermined areas, whereby the means for generating an ion beam is connected to a plastic hose, via which the means can be supplied with a doping gas, and the plastic hose is enclosed by a buffer hose, which can be filled with a buffer gas and closed off.

According to an advantageous configuration of the device according to the invention, the plastic hose is enclosed by a buffer hose. The buffer hose can preferably be filled with a buffer gas and closed off. The capability of being closed off in this connection means that here, in the case of intact plastic and buffer hoses, a change in the buffer gas—in particular relative to the composition and/or the pressure of the buffer gas—can take place only by diffusive processes through the wall of the buffer hose and/or the plastic hose.

According to another advantageous configuration, at least one pressure-measuring device is designed for monitoring the pressure in the buffer hose.

In this respect, the development of the pressure of the buffer gas can advantageously be monitored in the buffer hose, and optionally in the case of an excess drop of this pressure, a warning and/or a disconnecting of a doping gas feed can be initiated.

According to another advantageous configuration of the device according to the invention, the device has an outer housing, from which the plastic hose exits.

Consequently, the plastic hose is used within the outer housing, which excludes the formation of flashovers or arcs because of high electrical voltage used in the deflection means. The use of the plastic hose thus advantageously serves to prevent such voltage flashovers.

According to another advantageous configuration of the device according to the invention, an inner housing is designed, which encloses at least the semiconductor substrate and the deflection means. In particular, this inner housing can be evacuated. A housing that can be evacuated is defined as a housing that makes it possible to reduce the gas pressure in the interior to below 0.001 mbar, in particular less than 0.0000001 mbar (millibar).

In an especially advantageous way, this allows a good guiding and formation of the ion beam, without interactions with gas molecules occurring inside the inner housing.

Figure 2:
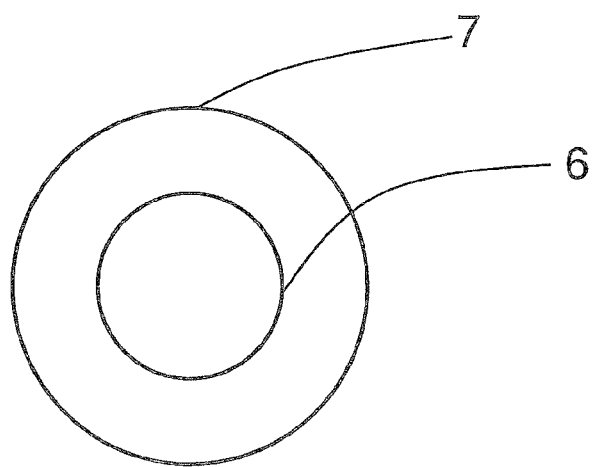

The details and advantages that are disclosed for the method according to this invention can be applied and transferred to the device according to the invention, and vice versa. Below, based on the attached figures, the invention is explained in more detail without being limited to the details and embodiments shown there. Here:

FIG. 1: diagrammatically shows an embodiment of a device according to the invention, and FIG. 2: diagrammatically shows a cross-section of a corresponding plastic hose with a buffer hose.

FIG. 1 diagrammatically shows a device 1 according to the invention. The latter is used for the treatment of a semiconductor substrate 2. A semiconductor substrate 2 is defined in particular as a so-called wafer, for example made of extremely pure silicon. In addition, the device 1 comprises a means 3 for generating an ion beam 4 and deflection means 5 for deflecting the ion beam 4. Deflection means 5 and means 3 for generating an ion beam 4 are designed in an inner housing 15 that can be evacuated in an ultra-high vacuum. An attachment 21 for doping gas is designed on the outside wall of the inner housing 15. The plastic hose 6 is connected in a gas-tight manner with this attachment 21.

An ion beam 4 can be directed onto the semiconductor substrate 2 with the deflection means 5. The deflection means 5 comprise positively- and negatively-charged electrodes. For the sake of clarity, deflection means, a deflection of the ion beam 4 perpendicular to the indicated deflection means 5 and perpendicular to the exit direction of the ion beam 4, are not indicated. The deflection means 5 cause an electrical field to build up between the electrodes, whose polarity depends on the polarity of the individual electrodes. The electrodes can be supplied with d.c. voltage or a.c. voltage. The direction of the field is perpendicular to the original exit direction of the ion beam 4.

High voltages of, for example, 90 kV or more are preferably applied to the deflection means 5. By variation of the electric voltage applied to the deflection means 5, the ion beam can be directed onto specific, predefined areas of the semiconductor substrate 2. In this connection, dopings in quite specific areas of the semiconductor substrate 2 can be achieved.

The means 3 for generating an ion beam 4 is supplied with a doping gas via a plastic hose 6. FIG. 2 diagrammatically shows a cross-section through the plastic hose 6. The latter is designed coaxially inside a buffer hose 7. During operation, the doping gas, for example arsine ($AsH_3$), phosphine ($PH_3$), silicon tetrafluoride ($SiF_4$) and boron trifluoride ($PF_3$), flows through the plastic hose. All gases are highly reactive, toxic gases that should not occur in the environment. In this connection, the buffer hose 7 offers the possibility of a reduction of the probability of a leak, on the one hand, and facilitates the discovery of leaks to a considerable extent, on the other hand. As a result, during operation, of the buffer hose 7 being filled with a buffer gas, for example with nitrogen ($N_2$), and the pressure in this buffer hose being monitored, the supply of doping gas can be immediately ended with the dropping of pressure of the buffer gas, which indicates a leak in the plastic hose 6 and/or the buffer hose 7. This can take place, for example, by shutting off the plastic hose 6 by a shut-off means 17. In this case, for example, this can be a pneumatically-actuated valve, in particular a high-grade steel valve. As a result, an exiting of the doping gas into the environment is prevented in a safe manner. The shut-off means 17 can also be designed at another appropriate location.

In addition, FIG. 1 shows the connection of the buffer hose 7 via a first data line to a control unit 9. The control unit 9 can contain a pressure-measuring head 19; the latter can also be designed on the buffer hose 7 and can send its data to the control unit 9 via the first data line 8. The corresponding pressure-measuring head 19 on the buffer hose 7 can be attached at any position of the buffer hose 7; in particular, a design in the coupling means 12 is preferred. In the control unit 9, the pressure data in the buffer hose 7 are recorded.

Based on these data, as well as in particular based on an analysis of the change in pressure over time, it is checked whether a leak is present in the plastic hose 6 and/or in the buffer hose 7. Should this be the case, the control unit 9 initiates a warning to an operator and/or immediately ends the supply of doping gas. Via second data lines 10 and third data lines 11, the control unit 9 is connected to gas sensors 20 that check the connecting points of the plastic hose 6 to the means 3 for generating an ion beam 4 and a coupling means 12 for leaks. These gas sensors are designed so that they can detect a few ppb (parts per billion, parts in one billion particles) of the doping gases in other gases. Based on the corresponding results of these gas sensors, an alarm is also issued to an operator and/or an interruption of the supply of doping gases takes place. In addition, the pressure of the doping gas is checked via a second pressure sensor 22, which is connected to a fifth data line 23 with the control unit 9. The pressure of the doping gas in the plastic hose 6 is 0.9 bar in this embodiment; the pressure of the buffer gas in the buffer hose 7 is more than one bar, in particular 1.5 bar to 2.0 bar. With an increase in the pressure of the doping gas in the plastic hose 6, which indicates a leak of the plastic hose, the control unit 9 emits a warning and/or ends the supply of doping gas. This takes place via the actuation of the shut-off means 17. The second pressure sensor 21 can also be designed in the coupling means 12.

The coupling means 12 is used for coupling the plastic hose 6 to a metal line 13. This metal line 13 is usually produced from steel, in particular from high-grade steel, and connects the coupling means 12 to a gas reservoir 14. In this case, the metal line 13 can be at a defined electrical potential, in particular at an electrical ground. The gas reservoir 14 is, for example, a conventional gas cylinder. In principle, within the scope of this invention, not just one means 3 can be connected to a gas reservoir 14 to generate an ion beam 4, but rather two or more means 3 can also be connected to a single, conventional gas reservoir 14 to generate an ion beam 4. The gas reservoir 14 is designed in principle outside of an inner housing 15 and an outer housing 16 of the device 1. The gas reservoirs 14 for the individual doping gases can thus be stored at correspondingly ventilated sites that are provided with filtering means. The design of the supply of the doping gas to the means 3 for generating an ion beam 4 as a plastic hose 6 prevents a flashover of the electric voltage to the plastic hose 6. The inner housing 15 comprises in particular the deflecting means 5 and the semiconductor substrate 2 as well as optionally the means 3 for generating an ion beam 4. The inner housing 15 preferably can be evacuated. The outer housing 16 encloses at least the inner housing 15. The plastic hose 6 is also guided into the outer housing 16.

The coupling means 12 also has the shut-off means 17, which is connected to the control unit 9 via a fourth data line 18. The coupling means 12 is preferred for the location of the shut-off means 17, since the metal line 13 is clearly less prone to leaks than the plastic hose 6.

The method according to the invention and the device according to the invention 1 advantageously make it possible to ensure the supply of the means 3 to generate an ion beam 4 with a doping gas from conventional gas reservoirs 14, such as, for example, conventional pressurized gas cylinders, for example at a pressure of 15 bar, 34 bar, 100 bar, 150 bar, or 300 bar, and volumes of 2, 5, 10, 20 or 50 liters. Voltage flashovers from the deflection means 5 are effectively prevented by use of a plastic hose 6, since the gas supply of means 3 for generating an ion beam 4 takes place in the outer housing 16 through the plastic hose 6. The method according to the invention and the device according to the invention 1 thus make it possible to ensure a simple design of a corresponding ion implantation device while at the same time supplying the same with doping gas at possibly a more reasonable price.

REFERENCE SYMBOL LIST

1 Device for the treatment of a semiconductor substrate
2 Semiconductor substrate
3 Means for generating an ion beam
4 Ion beam
5 Deflection means
6 Plastic hose
7 Buffer hose
8 First data line
9 Control unit
10 Second data line
11 Third data line
12 Coupling means
13 Metal line
14 Gas reservoir
15 Inner housing
16 Outer housing
17 Shut-off means
18 Fourth data line
19 Pressure-measuring head
20 Gas sensor
21 Attachment
22 Second pressure sensor
23 Fifth data line

The invention claimed is:

1. Method for the treatment of a semiconductor substrate, in which an ion beam is generated from a doping gas and is directed onto the semiconductor substrate, comprising:
 establishing a connection for feeding the doping gas through a plastic hose between i) a gas cylinder positioned outside of a device for the treatment of the semiconductor substrate where the ion beam is generated, and ii) said means for generating an ion beam;
 feeding the doping gas through said plastic hose to the means for generating the ion beam; and
 ionizing the doping gas to generate the ion beam.

2. Method according to claim 1, wherein a deflection of the ion beam is produced by application of at least one electrical field.

3. Method according to claim 1, wherein the plastic hose is enclosed by a buffer hose, which is filled with a buffer gas.

4. Method according to claim 3, wherein the buffer gas comprises an inert gas.

5. Method according to claim 4, wherein the buffer gas comprises at least one of the following gases:
 a) Nitrogen ($N_2$);
 b) Argon (Ar);
 c) Sulfur hexafluoride ($SF_6$).

6. Method according to claim 3, wherein the buffer gas comprises at least one of the following gases:
 a) Nitrogen ($N_2$);
 b) Argon (Ar);
 c) Sulfur hexafluoride ($SF_6$).

7. Method according to claim 3, wherein the pressure of the buffer gas is monitored.

8. Method according to claim 3, wherein the buffer gas has a filling pressure of 1.4 to 2.0 bar.

9. Method according to claim 7, wherein at least one of the following actions is performed if the pressure of the buffer gas falls below a first boundary pressure:
 I) Emitting a warning, and
 II) Interrupting the supply of doping gas.

10. Method according to claim 9, wherein the first boundary pressure is approximately 70% to 90% of the filling pressure of the buffer gas.

11. Method according to claim 8, wherein at least one of the following actions is performed if the pressure of the buffer gas falls below a first boundary pressure:
 J) Emitting a warning, and
 II) Interrupting the supply of doping gas.

12. Method according to claim 1, wherein the doping gas comprises at least one of the following gases:
 i) Arsine ($AsH_3$);
 ii) Phosphine ($PH_3$);
 iii) Boron trifluoride ($BF_3$), and
 iv) Silicon tetrafluoride ($SiF_4$).

13. Method according to claim 1, wherein the doping gas is fed at a pressure of 0.8 to 1.0 bar.

14. Method according to claim 1, wherein the plastic hose is made of tetrafluoroethylene/perfluoroalkoxy/vinyl ether-copolymerizate (PFA).

15. Method according to claim 1, wherein the plastic hose is made of polyvinylidene fluoride (PVDF).

16. Method according to claim 3, wherein the plastic hose and the buffer hose are each made of tetrafluoroethylene/perfluoroalkoxy/vinyl ether-copolymerizate (PFA).

17. Method according to claim 3, wherein the plastic hose and the buffer hose are each of polyvinylidene fluoride (PVDF).

18. Method according to claim 3, wherein,
 the plastic hose and the buffer hose are each made of one of the group consisting of i) tetrafluoroethylene/perfluoroalkoxy/vinyl ether-copolymerizate (PFA), and ii) polyvinylidene fluoride (PVDF),
 the plastic hose and buffer hose each being flexible to allow bending in a further step of establishing a connection for feeding the doping gas by said plastic hose between i) one of a plurality interchangeable gas cylinders positioned outside of a device for the treatment of the semiconductor substrate where the ion beam is generated, and ii) said means for generating an ion beam, the plastic hose being connectable to each of the interchangeable gas cylinders.

19. Method for the treatment of a semiconductor substrate, in which an ion beam is generated from a doping gas and is directed onto the semiconductor substrate, comprising:
 establishing a connection for feeding the doping gas through a plastic hose between i) one of a plurality interchangeable gas cylinders positioned outside of a device for the treatment of the semiconductor substrate where the ion beam is generated, and ii) said means for generating an ion beam, the plastic hose being connectable to each of the interchangeable gas cylinders;
 feeding the doping gas through said plastic hose to the means for generating the ion beam; and
 ionizing the doping gas to generate the ion beam.

* * * * *